(12) United States Patent
Ramaneti et al.

(10) Patent No.: US 10,946,344 B2
(45) Date of Patent: Mar. 16, 2021

(54) FORMATION OF DIAMOND MEMBRANES

(71) Applicants: IMEC VZW, Leuven (BE);
Universiteit Hasselt, Hasselt (BE)

(72) Inventors: Rajesh Ramaneti, Hasselt (BE);
Giedrius Degutis, Hasselt (BE); Ken Haenen, Hasselt (BE); Marlies Van Bael, Molenbeek-Wersbeek (BE);
Paulius Pobedinskas, Boncelles (BE)

(73) Assignees: IMEC VZW, Leuven (BE);
UNIVERSITEIT HASSELT, Hasselt (BE)

( * ) Notice: Subject to any disclaimer, the term of this patent is extended or adjusted under 35 U.S.C. 154(b) by 0 days.

(21) Appl. No.: 16/385,412

(22) Filed: Apr. 16, 2019

(65) Prior Publication Data

US 2019/0314766 A1 Oct. 17, 2019

(30) Foreign Application Priority Data

Apr. 16, 2018 (EP) .................................. 18167416

(51) Int. Cl.
*H01L 21/32* (2006.01)
*H01L 21/02* (2006.01)
(Continued)

(52) U.S. Cl.
CPC ..... *B01D 67/0051* (2013.01); *B01D 67/0062* (2013.01); *B01D 67/0072* (2013.01);
(Continued)

(58) Field of Classification Search
CPC ..................... H01L 21/76876; H01L 21/02115
See application file for complete search history.

(56) References Cited

U.S. PATENT DOCUMENTS 7,939,367 B1 * 5/2011 Nasser-Faili ...... H01L 21/02115
438/105
8,039,301 B2 10/2011 Kub et al.
(Continued)

FOREIGN PATENT DOCUMENTS

WO 2016/168796 A1 10/2016
WO 2016/180849 A1 11/2016

OTHER PUBLICATIONS

European Search Report, European Patent Application No. 18167416.9, dated Oct. 15, 2018, 8 pages.
(Continued)

*Primary Examiner* — Moazzam Hossain
(74) *Attorney, Agent, or Firm* — McDonnell Boehnen Hulbert & Berghoff LLP

(57) ABSTRACT

In a first aspect, the present disclosure relates to a method for forming a diamond membrane, comprising: providing a substrate having an amorphous dielectric layer thereon, the amorphous dielectric layer comprising an exposed surface, the exposed surface having an isoelectric point of less than 7, preferably at most 6; seeding diamond nanoparticles onto the exposed surface; growing a diamond layer from the seeded diamond nanoparticles; and removing a portion of the substrate from underneath the diamond layer, the removed portion extending at least up to the amorphous dielectric layer, thereby forming the diamond membrane over the removed portion.

14 Claims, 6 Drawing Sheets

(51) Int. Cl.
  *H01L 21/8238* (2006.01)
  *B01D 67/00* (2006.01)
  *B01D 71/02* (2006.01)
  *H01L 21/768* (2006.01)
  *B01D 69/10* (2006.01)

(52) U.S. Cl.
  CPC ...... *B01D 71/021* (2013.01); *H01L 21/02115* (2013.01); *H01L 21/32* (2013.01); *H01L 21/76876* (2013.01); *H01L 21/823807* (2013.01); *B01D 69/105* (2013.01); *B01D 2325/02* (2013.01); *B01D 2325/08* (2013.01); *B01D 2325/26* (2013.01)

(56) References Cited

U.S. PATENT DOCUMENTS

| | | | |
|---|---|---|---|
| 9,484,178 B2 | 11/2016 | Yamada et al. | |
| 2001/0014516 A1* | 8/2001 | Shimoji | H01L 27/0688 438/458 |
| 2007/0232074 A1* | 10/2007 | Ravi | H01L 21/02502 438/758 |
| 2009/0146186 A1* | 6/2009 | Kub | H01L 29/66462 257/194 |
| 2013/0084436 A1* | 4/2013 | Sumant | B01D 69/105 428/195.1 |
| 2013/0299796 A1* | 11/2013 | Masuyama | B81C 1/00031 257/40 |
| 2014/0110722 A1* | 4/2014 | Kub | H01L 23/3732 257/77 |
| 2015/0107163 A1* | 4/2015 | Konovalov | E21B 10/567 51/298 |
| 2016/0060488 A1* | 3/2016 | Singh | C09K 3/1463 216/53 |
| 2016/0197027 A1* | 7/2016 | Nasser-Faili | C23C 16/27 257/76 |
| 2016/0293871 A1* | 10/2016 | Cao | H01L 51/105 |
| 2017/0236713 A1 | 8/2017 | Khan | |
| 2017/0243732 A1* | 8/2017 | Inamoto | H01L 29/1608 |
| 2017/0271235 A1* | 9/2017 | Lowe | H01L 21/02527 |
| 2019/0382278 A1* | 12/2019 | Fujii | C04B 35/488 |

OTHER PUBLICATIONS

Divan, Ralu et al., "High-Aspect-Ratio Nanoporous Membranes Made by Reactive Ion Etching and E-Beam and Interference Lithography", Microsystem Technologies, vol. 20, No. 10, Oct. 13, 2013, pp. 1797-1802.

Skoog, Shelby A. et al., "Ultrananocrystalline Diamond-Coated Microporous Silicon Nitride Membranes for Medical Implant Applications", The Journal of the Minerals, Metals & Materials Society, vol. 64, No. 4, Apr. 3, 2012, pp. 520-525.

Pobedinskas, P. et al., "Surface Plasma Pretreatment for Enhanced Diamond Nucleation on AlN", Applied Pysics Letters, vol. 102, May 23, 2013, pp. 201609-1-201609-4.

Ramesham, R. et al., "Selective Growth of Polycrystalline Diamond Thin Films on a Variety of Substrates Using Selective Damaging by Ultrasonic Agitation", J. Mater. Res., vol. 7, No. 5, May 1992, pp. 1144-1151.

Shimoni, Olga et al., "Development of a Templated Approach to Fabricate Diamond Patterns on Various Substrates", Applied Materials & Interfaces, vol. 6, May 30, 2014, pp. 8894-8902.

Pobedinskas, P. et al., "Influence of Hydrogen and Hydrogen/Methane Plasmas on AlN Thin Films", Applied Physics Letters., vol. 104, Feb. 27, 2014, pp. 081917-1-081917-4.

Makarova, Olga V. et al., "Nanoporous Ultra-Nanocrystalline Diamond Membranes", Journal of Vacuum Science & Technology, Nov. 2010, 5 pages.

* cited by examiner

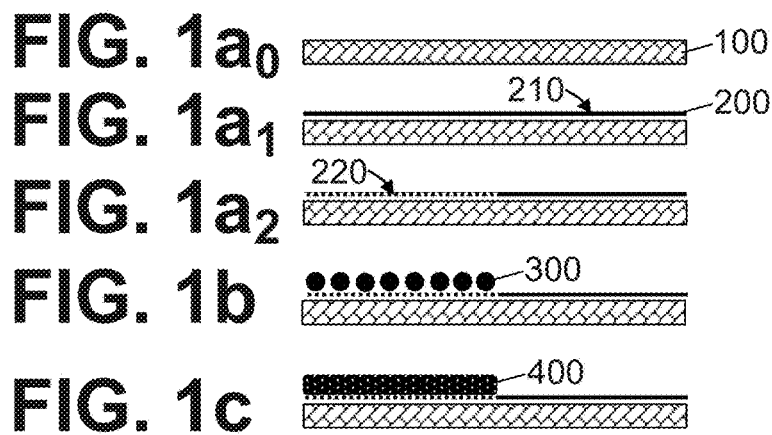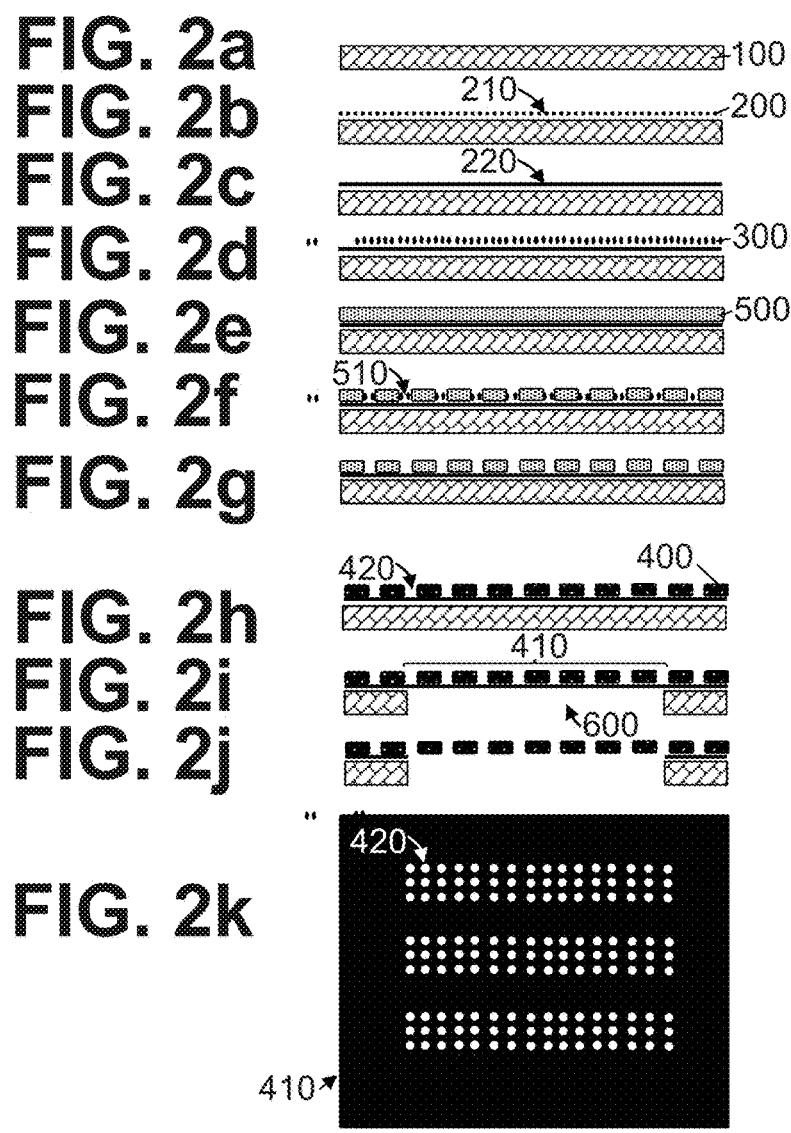

FORMATION OF DIAMOND MEMBRANES

CROSS-REFERENCE TO RELATED APPLICATIONS

The present application is a non-provisional patent application claiming priority to European Patent Application No. 18167416.9, filed Apr. 16, 2018, the contents of which are hereby incorporated by reference.

FIELD OF THE DISCLOSURE

The present disclosure relates to the fabrication of diamond membranes and in particular the formation of porous or non-porous diamond membranes from seeded diamond nanoparticles.

BACKGROUND

Porous or non-porous diamond membranes have a broad scope of applications, ranging from membrane technology for microfiltration and particle separation to functionalized biocompatible membranes for life science applications. Several approaches have been described to produce these diamond membranes, but all come with significant shortcomings.

Skoog et al. used microwave plasma chemical vapor deposition to deposit a 150 nm thick ultra-nanocrystalline diamond membrane on a commercially available 200 nm thick microporous silicon nitride membrane containing an array of 100×100 2.5 µm diameter pores. (Skoog, Shelby A., et al. "Ultrananocrystalline Diamond-Coated Microporous Silicon Nitride Membranes for Medical Implant Applications," The Journal of the Minerals, Metals & Materials Society, 64.4 (2012): 520-525.) However, such a membrane requires delicate handling during the processing. Furthermore, such silicon nitride membranes (with or without the diamond membrane) may not be well suited for use in a larger industrial scale. As such, this method is not sufficiently robust and may even be unreliable, e.g. for being subjected to human error during sample handling and transportation. Then, the addition of an extra diamond layer may impact the stability of the diamond layer. Besides, the stability of the silicon nitride membrane may be impacted during the diamond growth, resulting in an unviable or unreliable process and thus may not be suitable for large industrial scale. Furthermore, $SiN_x$, an additional conductive layer comprising nitrogen vacancy centers, would have to be applied to impart conductivity. This is radiation incompatible during biological studies.

US2013084436A1 discloses a method to fabricate nanoporous diamond membranes. A silicon substrate is provided and optical lithography is used to produce metal dots on the silicon substrate with a predefined spacing between the dots. The metal dots are seeded with a nanodiamond solution in water, followed by controlled lateral diamond film growth. Back etching of the underlying silicon is performed to open the nanopores in the produced nanoporous diamond membrane. However, it is well known that use of metal layers is avoided in CMOS (Complementary Metal Oxide Semiconductor) industry processing, as these might create metallic contamination in associated devices. Furthermore, the nanopores so obtained have poor definition (e.g. they have irregular shapes of varying sizes) and are non-uniform over a large area. This could be detrimental to the stability of the membranes.

Makarova et al. formed nanoporous diamond membranes by fabricating pores ranging in diameter from 100 to 2000 nm in a 1 µm-thick ultrananocrystalline diamond film on silicon wafers using e-beam and optical lithography, reactive ion etching, and laser writing. (Makarova, Olga, et al. "Nanoporous ultra-nanocrystalline diamond membranes." Journal of Vacuum Science & Technology B, Nanotechnology and Microelectronics: Materials, Processing, Measurement, and Phenomena 28.6 (2010): C6P42-C6P47.) However, the above-mentioned top-down approach based on dry etch lithographic patterning does not always lead to favourable results, particularly for thick diamond films, e.g. the dimensions and aspect ratio of the pores that is achievable may be limited and/or the obtained diamond membranes may demonstrate poor surface properties, such as considerable surface roughness or variations in surface roughness. This approach may furthermore require aggressive etch processing steps, may typically requires relatively specialized technical tools to define the pores, and can be relatively expensive to perform as it adds high processing costs.

There is thus still a need in the art for methods for forming diamond membranes which address some or all of the above-mentioned shortcomings. Such a method could, for example, be robust, reproducible, scalable to an industrial level and compatible with CMOS technology.

SUMMARY

The present disclosure provides diamond membranes and methods for forming these diamond membranes. This is accomplished by methods, products and uses according to the present disclosure.

Some embodiments allow for the fabrication of both porous and non-porous diamond membranes. Some embodiments allow for the making of a porous diamond membrane with well-defined pores. Some embodiments allow for the making of porous membranes without relying on delicate pre-patterned porous substrates.

Through these embodiments, the diamond membrane can span a relatively large area. Some embodiments allow for the fabrication of the diamond membranes on large area substrates.

Some embodiments result in a robust method that yields reproducible results.

Some embodiments allow the method to be scaled to an industrial level. The method can be performed in a cleanroom fab based on existing CMOS processes. Some embodiments of the present disclosure can be adapted to future microelectronic processes.

Some embodiments of the present disclosure allow the diamond membranes to be fabricated in a relatively economical and cost-effective fashion. Some embodiments of the present disclosure allow the diamond membrane to be formed in a way that is not time-consuming.

Some embodiments of the present disclosure allow a diamond layer to be grown area-selectively (e.g. by patterning the seeded diamond nanoparticles or by controlling where the patterned nanoparticles are seeded). This is in contrast to the top-down lithographical patterning of an already grown diamond layer, which is typically a relatively aggressive procedure and can easily damage the diamond surface and/or diamond layer.

Some embodiments of the present disclosure allows for the formation method without the use of metals (e.g. hard metal masks), which could cause contamination of neighboring components (e.g. CMOS devices). Some embodiments of the present disclosure allow the method to be compatible with CMOS technology and processes.

Some embodiments of the present disclosure allow the fabricated diamond membranes to be free-standing membranes.

Some embodiments of the present disclosure allow the diamond membranes to be formed on a variety of substrates.

Some embodiments of the present disclosure allow the diamond membranes to be bio-compatible.

Some embodiments of the present disclosure allow the diamond membranes to be surface (bio-)functionalized, e.g. with the intention to capture and/or monitor molecules in a flow.

Some embodiments of the present disclosure allow nitrogen-vacancy centers to be incorporated into the diamond membranes, e.g. near a pore in a porous membrane.

Some embodiments of the present disclosure allow the diamond membranes to be made in such a way that they are conductive, i.e. without the need for an independent conductive layer. For instance, the diamond membranes can be made of alternating multilayers of conductive and non-conductive diamond materials, with different dopants, doping concentrations or doping gradients.

Some embodiments of the present disclosure allow the diamond membranes to be relatively thick.

Some embodiments of the present disclosure allow the diamond membranes to be used in a wide range of applications.

In a first aspect, the present disclosure relates to a method for forming a diamond membrane, comprising: providing a substrate having an amorphous dielectric layer thereon, the amorphous dielectric layer comprising an exposed surface, the exposed surface having an isoelectric point of less than 7, preferably at most 6; seeding diamond nanoparticles onto the exposed surface; growing a diamond layer from the seeded diamond nanoparticles; and removing a portion of the substrate from underneath the diamond layer, the removed portion extending at least up to the amorphous dielectric layer, thereby forming the diamond membrane over the removed portion.

In a second aspect, the present disclosure relates to a diamond membrane as obtainable by the method according to any embodiment of the first aspect.

In a third aspect, the present disclosure relates to a use of an amorphous dielectric layer in the formation of a diamond membrane, wherein the amorphous dielectric layer comprises an exposed surface having an isoelectric point of less than 7, preferably at most 6.

Some aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE FIGURES

The above, as well as additional, features will be better understood through the following illustrative and non-limiting detailed description of example embodiments, with reference to the appended drawings.

FIGS. $1a_0$-$1c$ show schematic vertical cross-sections of different steps for forming a diamond layer and/or membrane, according to an example embodiment.

FIGS. $2a$-$2j$ show schematic vertical cross-sections of different steps for forming a diamond membrane, according to an example embodiment.

FIG. $2k$ shows a top view of FIG. $2j$.

FIGS. $3a$-$3e$ show microscopic images of porous diamond membranes, according to an example embodiment.

FIGS. $4a$-$4b$ show results of X-ray photoelectron spectroscopy (XPS) measurements on different amorphous dielectric layers, illustrating the effect of fluorination on the exposed surface, according to an example embodiment.

FIGS. $5a$-$5b$ show results of X-ray photoelectron spectroscopy (XPS) measurements on different amorphous dielectric layers, illustrating the effect of fluorination on the exposed surface, according to an example embodiment.

FIGS. $6a$-$6b$ show results of X-ray photoelectron spectroscopy (XPS) measurements on different amorphous dielectric layers, illustrating the effect of fluorination on the exposed surface, according to an example embodiment.

Figure 7:
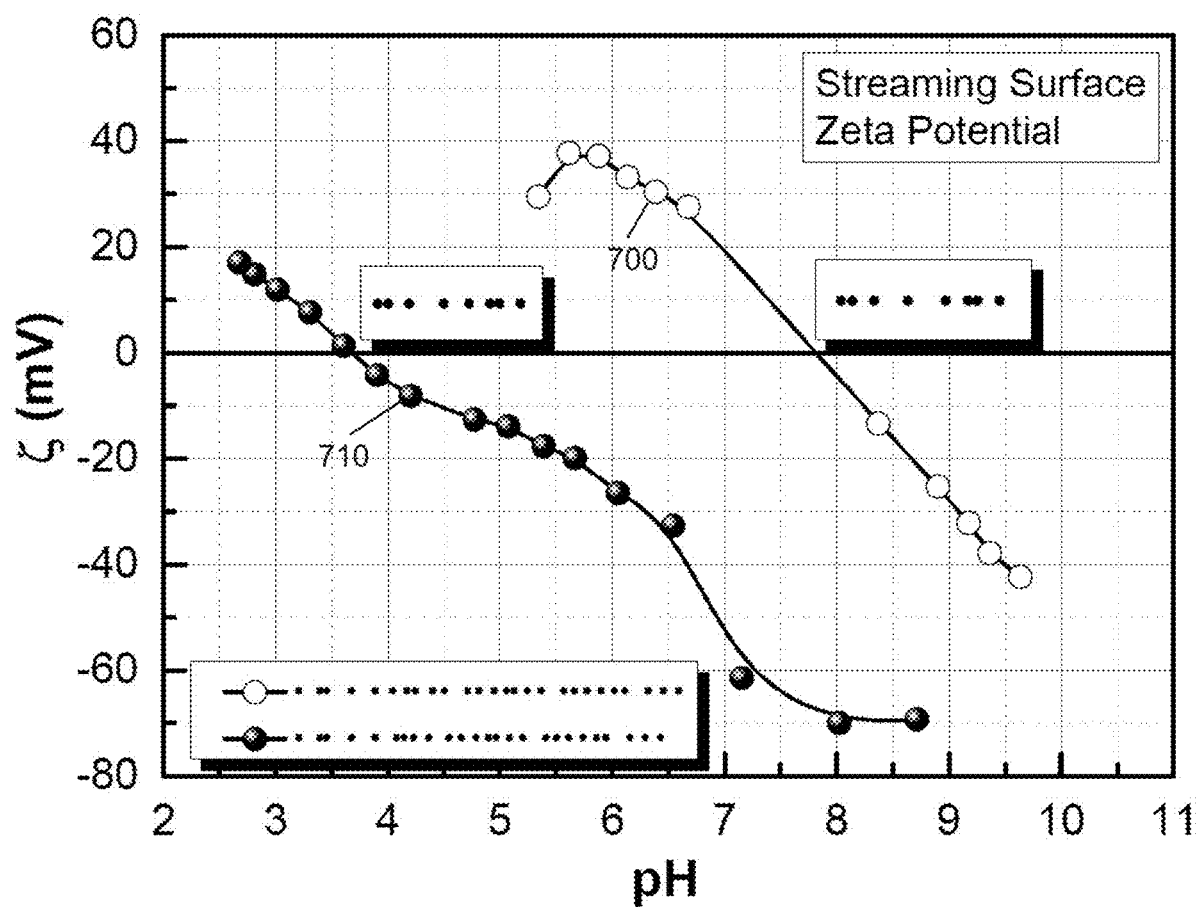

FIG. 7 shows results of Streaming Zeta Potential (SZP) measured on an amorphous dielectric, measuring the surface charge (Zeta potential) under exposure to a variable pH, before and after surface treatment, according to an example embodiment.

In the different figures, the same reference signs refer to the same or analogous elements.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable with their antonyms under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of example embodiments of the disclosure, various features of the disclosure are sometimes grouped together in a single embodiment, figure, or description thereof for the purpose of streamlining the disclosure and aiding in the understanding of one or more of the various aspects. This method of disclosure, however, is not to be interpreted as reflecting an intention that the claims require more features than are expressly recited in each claim. Rather, as the following claims reflect, some aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosure.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The following terms are provided solely to aid in the understanding of the disclosure.

As used herein and unless otherwise specified, a diamond membrane is a diamond layer, or a portion thereof, which is at least partially unsupported by the substrate on which it is formed. A diamond membrane may also be referred to more explicitly as a free-standing diamond membrane or free-standing diamond layer. For example, a portion of the substrate may be removed and the diamond membrane may span over the removed portion. In some embodiments, the diamond membrane may be considered to be specifically that portion of the diamond layer that spans over the removed portion of the substrate. In embodiments, the diamond membrane may be porous, i.e. comprising one or more pores, or non-porous, i.e. not comprising pores. In embodiments, the diamond membrane may comprise poly-, micro-, meso-, nano- or ultra-nanocrystalline diamond.

As used herein and unless otherwise specified, any pH value refers to a pH value as measured in an aqueous medium.

As used herein and unless otherwise specified, a diamond layer is considered to be grown area-selectively when growing the diamond layer results directly in a patterned diamond layer. This is opposed to a situation in which a more or less uniform diamond layer is first grown and subsequently patterned (e.g. using a subtractive patterning technique). The patterned diamond layer may, for example, comprise pores (e.g. forming one or more pore arrays) or trenches (e.g. forming a grid-pattern).

In a first aspect, the present disclosure relates to a method for forming a diamond membrane, comprising: providing a substrate having an amorphous dielectric layer thereon, the amorphous dielectric layer comprising an exposed surface, the exposed surface having an isoelectric point of less than 7, preferably at most 6; seeding diamond nanoparticles onto the exposed surface; growing a diamond layer from the seeded diamond nanoparticles; and removing a portion of the substrate from underneath the diamond layer, the removed portion extending at least up to the amorphous dielectric layer, thereby forming the diamond membrane over the removed portion.

The substrate may typically be any substrate, provided it can have the amorphous dielectric layer thereon and can support the layers overlaying it (e.g. during seeding diamond nanoparticles onto the exposed surface and growing the diamond layer from the seeded diamond nanoparticles). In embodiments, the substrate may be a semiconductor substrate, such as a Si, Si/SiO$_x$ (e.g. Si/SiO$_2$), Si/Si$_x$N$_y$, (e.g. Si$_3$Ni$_4$), GaAs or GaN substrate. In other embodiments, the substrate may be another substrate, such as glass. In embodiments, the substrate may be different from diamond as such. In embodiments, the substrate may have a size of at least 1 µm×1 µm, including at least 10 µm×10 µm, further including at least 100 µm×100 µm, also including at least 1 mm×1 mm, such as 1 cm×1 cm. In embodiments, the substrate may have an area of at least 1 µm$^2$, including at least 100 µm$^2$, further including at least 10000 µm$^2$, also including at least 1 mm$^2$, such as 1 cm$^2$ or more.

The dielectric layer being amorphous (e.g. comprising an amorphous dielectric) enables efficient growth thereon of the diamond layer when growing the diamond layer from the seeded diamond nanoparticles; in contrast, a crystalline dielectric layer would typically result in a lattice mismatch with respect to the diamond layer, thereby hindering its growth and/or facilitating the diamond layer from peeling off from the dielectric layer. The dielectric layer may promote a robust adhesion between the substrate and the diamond layer. Furthermore, use of the dielectric layer expands the range of substrates on which the diamond layer can be successfully formed. In embodiments, the amorphous dielectric layer may have a thickness of 20 nm or below, including 10 nm or below, further including 5 nm or below, also including 2 nm or below, such as a thickness of 1 nm.

In embodiments, the amorphous dielectric layer may have an intrinsic (i.e. innate; e.g. before any modification of the exposed surface) isoelectric point of at least 5, including at least 6, such as between 7 and 12. In embodiments, the amorphous dielectric layer may have a relative permittivity of 3.9 or more, including at least 7, further including at least 9; the amorphous dielectric layer may, for example, be a high-k dielectric. In embodiments, the amorphous dielectric layer may be an amorphous oxide. In some embodiments, the amorphous dielectric layer may be selected from $Al_2O_3$, $HfO_2$, MgO, GaN, and $Ga_2O_3$, likely from $Al_2O_3$, $HfO_2$ or MgO. High-k dielectrics such as $Al_2O_3$, $HfO_2$ or MgO typically have a high intrinsic isoelectric point (e.g. between 7 and 12), which may be brought below 7 using a surface treatment.

In embodiments, providing a substrate having an amorphous dielectric layer thereon may comprise: providing the amorphous dielectric layer on the substrate having an isoelectric point of at least 7, preferably at least 8, and applying a surface treatment (e.g. a surface plasma treatment) to the exposed surface, thereby modifying the isoelectric point of the exposed surface to be less than 7, preferably at most 6.

In embodiments, the surface treatment may comprise a halogenation. In embodiments, the halogenation may be selected from a fluorination, chlorination, bromination, iodination or astanation. In embodiments, the halogenation may comprise the use of halogen ions or halogen compounds. The use of fluorine may be beneficial as, compared to other halogens (e.g. chlorine, bromine or iodine), it does not typically etch the amorphous dielectric. In some embodiments, the surface treatment may be applied to the entire exposed surface. In other embodiments, the surface treatment may be limited to a second area of the exposed surface, while leaving a first area of the exposed surface unmodified. Alternatively, a further surface treatment (e.g. a re-oxidation; cf. infra) can later be used to re-increase the isoelectric point; typically, such a further treatment is applied in a way that only a limited area of the exposed surface is thereby affected. Regardless, a straightforward platform is obtained for controlling the isoelectric point of the exposed surface (and by extension its zeta potential) of a first area independently from a second area. A patterned exposed surface can thus be obtained comprising areas with a first isoelectric point (e.g. having a negative zeta potential) and areas with a second isoelectric point (e.g. having a positive zeta potential). Such a patterned exposed surface can be used for area-selectively seeding the diamond nanoparticles and subsequently area-selectively growing the diamond layer.

In some embodiments, the exposed surface may have a negative zeta potential. In embodiments, particularly during seeding the diamond nanoparticles, the exposed surface may be in contact with a medium having a pH higher than the isoelectric point of the exposed surface. When the exposed surface is in contact with the medium having the pH higher than its isoelectric point, the exposed surface will typically have a negative zeta potential. In embodiments, the medium may have a pH between 2 and 8. This medium may be the mixture comprising the diamond nanoparticles (cf. infra).

In embodiments, seeding diamond nanoparticles onto the exposed surface may comprise contacting a mixture comprising the diamond nanoparticles with the exposed surface. In embodiments, the mixture may have a pH higher than the isoelectric point of the exposed surface. In embodiments, the mixture may be an aqueous suspension of the diamond nanoparticles. In embodiments, the mixture may have a pH between 2 and 9, including between 3 and 8.

In some embodiments, the diamond nanoparticles may have a positive zeta potential. The diamond nanoparticles may, for example, be hydrogen-terminated. Hydrogen-terminated diamond nanoparticles may be hydrophobic nanoparticles. They are typically positively charged in a medium having a pH between 2 and 8; they may, for example, have a zeta potential of about 50 mV in an aqueous suspension having a pH of 5.5. In other embodiments, the diamond nanoparticles may have a negative zeta potential. Alternatively, the diamond nanoparticles may, for example, be oxygen-terminated. Oxygen-terminated diamond nanoparticles may be hydrophilic nanoparticles. They are typically negatively charged in a medium having a pH between 2 and 8; they may, for example, have a zeta potential of about −40 mV in an aqueous suspension having a pH of 5.5. The colloidal stability of hydrogen-terminated diamond nanoparticles is typically higher than that of oxygen-terminated diamond nanoparticles. For example, oxygen-terminated diamond nanoparticles may typically display a tendency to cluster and agglomerate, and their behavior may vary as a function of the pH. Conversely, hydrogen-terminated diamond nanoparticles may typically be relatively independent of pH (e.g. their zeta potential may be relatively constant) in the pH range of 3 to 8 and their colloids may only become unstable at pH values above 9. Alternative reasons for using hydrogen-terminated diamond nanoparticles over oxygen-terminated diamond nanoparticles may be related to the higher nucleation density of hydrogen-terminated diamond nanoparticles, their suitability for a wider range of surfaced, and/or their higher selectivity, higher resolution and sharper definition of feature sizes during selective area growth. Furthermore the exposed surface may have a negative zeta potential, while the diamond nanoparticles may have a positive zeta potential. The coulombic attraction between both facilitates a good seeding of the diamond nanoparticles onto the exposed surface (e.g. onto the desired areas thereof). It was observed that, particularly under those conditions, the diamond layer grown is highly coalescent. The above notwithstanding, the disclosure may, in some embodiments, still work using diamond nanoparticles with a negative zeta potential, nevertheless these may be less effective and their colloidal suspensions may be less stable.

In embodiments, the exposed surface may have a size of at least 1 μm×1 μm, including at least 10 μm×10 μm, further including at least 100 μm×100 μm, and also including at least 1 mm×1 mm, such as 1 cm×1 cm. In embodiments, seeding diamond nanoparticles may comprise seeding the diamond nanoparticles onto the exposed surface over an area of at least 1 μm², including at least 100 μm², further including at least 10000 μm², and also including at least 1 mm², such as 1 cm². The present disclosure allows forming diamond layers and/or membranes over a large area.

In embodiments, growing a diamond layer from the seeded diamond nanoparticles may comprise a low temperature (e.g. 350 to 599° C.) or a high temperature (e.g. 600 to 800° C.) diamond formation. In embodiments, growing a diamond layer from the seeded diamond nanoparticles may comprise use of a chemical vapor deposition. In embodiments, growing a diamond layer from the seeded diamond nanoparticles may comprise use of a microwave source, such as a hotwire filament or a linear antenna microwave. In embodiments, growing a diamond layer from the seeded diamond nanoparticles may comprise growing the diamond layer using a carbon source (e.g. $CH_4$, for example, provided by the chemical vapor deposition) in a hydrogen plasma (e.g., provided by the microwave source). In embodiments, the diamond layer may comprise poly-, micro-, meso-, nano- or ultra-nanocrystalline diamond. In embodiments, a carbon-containing auxiliary layer may overlay the seeded diamond nanoparticles before growing the diamond layer from the seeded diamond nanoparticles and the carbon-containing auxiliary layer may act as a carbon-source during the growing. If a carbon-containing auxiliary layer (e.g. a mask layer, cf. infra) is present on the seeded diamond nanoparticles before growing the diamond layer, there is typically no need to remove it prior to the growing, as this layer can typically be used as a carbon-source (e.g. in addition to another carbon source, such as $CH_4$) and transformed into a diamond layer.

In embodiments, removing a portion of the substrate from underneath the diamond layer may comprise a wet or dry etching technique suitable for removing the portion of the substrate from underneath the diamond layer. In embodiments, said etching technique may be performed selectively with respect to the amorphous dielectric layer; e.g. the amorphous dielectric layer may act as an etch stop layer. Removing a portion of the substrate from underneath the diamond layer, the removed portion extending at least up to the amorphous dielectric layer, means that a portion of the substrate is removed in such a way as to expose a corresponding portion of the amorphous dielectric layer that was in contact with the substrate)

In embodiments, removing a portion of the substrate from underneath the diamond layer may further comprise removing a portion of the amorphous dielectric layer, such that the removed portion extends up to the diamond layer (i.e. a portion of the amorphous dielectric layer is removed in such a way as to expose a corresponding portion of the diamond layer that was in contact with the amorphous dielectric layer). In embodiments, removing the portion of the amorphous dielectric layer may comprise an ion beam etching, a reactive ion etching or a wet etching. In doing so, the diamond membrane is opened up from the bottom, e.g. allowing pores in a porous diamond membrane (cf. infra) to communicate both with a region above the diamond membrane and a region below the diamond membrane.

In embodiments, growing the diamond layer from the seeded diamond nanoparticles c may be performed area-selectively. The diamond layer may, for example, be grown over a second area of the exposed surface and not over a first area of the exposed surface. In embodiments, performing the growing area-selectively may be based on growing the diamond layer from diamond nanoparticles which are seeded in a pattern (e.g. they form a non-continuous layer). The diamond nanoparticles may, for example, be seeded onto the second area of the exposed surface and not onto the first area of the exposed surface.

In a first type of embodiments, seeding the diamond nanoparticles onto the second area and not onto the first area may be based on a difference in isoelectric point (e.g. a difference in zeta potential) between the first and the second area. The second area may, for example, have an isoelectric point of less than 7 (e.g. 6 or less) and the first area may, for example, have an isoelectric point of at least 7 (e.g. 8 or more).

In a second type of embodiments, seeding the diamond nanoparticles onto the second area and not onto the first area may be based on the use of a mask and/or on a lithographic technique. In embodiments, the method may further comprise patterning the seeded diamond nanoparticles by removing the diamond nanoparticles in a first area but not in a second area, after the seeding diamond nanoparticles onto the exposed surface and before growing a diamond layer from the seeded diamond nanoparticles.

In embodiments, patterning the seeded diamond nanoparticles may comprise: providing a mask layer (e.g. a photoresist, such as a chemically amplified photoresist) over the seeded diamond nanoparticles, patterning at least one opening into the mask layer, and removing (e.g. by oxidation, such as wet oxidation or plasma oxidation) the seeded diamond nanoparticles within the opening.

In other embodiments, patterning the seeded diamond nanoparticles may comprise patterning the seeded diamond nanoparticles using a maskless lithography technique, such as e-beam lithography, extreme ultraviolet (EUV) lithography, laser interference lithography, micro- or nanoimprint lithography, direct write laser lithography or dip pen lithography. As an alternative to patterning the seeded diamond nanoparticles, in embodiments, the method may comprise: providing a patterned mask layer over the exposed surface, the patterned mask layer comprising at least one opening, performing the seeding the diamond nanoparticles onto the exposed surface (e.g. into the at least one opening), and removing the patterned mask layer from the exposed surface.

In this alternative, the diamond nanoparticles which are not seeded within the opening (e.g. which are seeded onto the mask layer) are readily removed together with said mask layer, such as to again obtain diamond nanoparticles which are seeded in a pattern. This alternative may be better suited when used in combination with thinner (e.g. less than 1 μm, including less than 500 nm, further including less than 250 nm, also including less than 100 nm) mask layers, whereas the embodiments wherein the mask layer overlays the seeded nanoparticles may be better suited when used in combination with thicker (e.g. more than 1 μm) mask layers. In embodiments, a thicker mask layer may have a thickness sufficient to withstand an oxygen plasma etch for at least 3 minutes, including at least 4 minutes. 4 minutes is a typical maximum surface plasma oxidation treatment time suitable for the present disclosure.

In embodiments, the first type of embodiments and the second type of embodiments may be used independently or they may be combined. However, achieving a good area-selective diamond layer growth may be more difficult when using the first type, as some diamond nanoparticles may nevertheless become attached in the second area and these may likewise grow. As such, the second type of embodiments, or a combination with said second type, is beneficial.

In embodiments, any feature of any embodiment of the first aspect may independently be as correspondingly described for any other aspect or their embodiments.

In a second aspect, the present disclosure relates to a diamond membrane as obtainable by the method according to any embodiment of the first aspect.

In embodiments, the diamond membrane may have a size of at least 10 nm×10 nm, including at least 100 nm×100 nm, further including at least 1 µm×1 µm, and also including at least 1 mm×1 mm, such as 1 cm×1 cm. In embodiments, seeding diamond nanoparticles may comprise seeding the diamond nanoparticles onto the exposed surface over an area of at least 100 nm$^2$, including at least 10000 nm$^2$, further including at least 1 µm$^2$, and also including at least 1 mm$^2$, such as 1 cm$^2$.

In embodiments, the diamond membrane may be porous, e.g. it may comprise one or more pores. In embodiments, a plurality of pores may form a regular pattern. In embodiments, the pores may have a depth equal to the diamond membrane thickness (e.g. they may run through the entire diamond membrane thickness). In embodiments, the pores may have at least one dimension parallel to their depth measuring from 1 nm to 100 µm, including from 100 nm to 10 µm; further, each dimension parallel to their depth may measure from 1 nm to 100 µm, including from 100 nm to 10 µm.

In embodiments, the diamond membrane may be a conductive diamond membrane. In embodiments, the diamond membrane may be a doped diamond membrane. In embodiments, the diamond membrane may be doped with p-type dopants (e.g. boron or nitrogen) or n-type dopants (e.g. phosphorus).

In embodiments, the diamond membrane may comprise nitrogen-vacancy centers. In embodiments, the diamond membrane may be bio-compatible. In embodiments, the diamond membrane may be bio-functionalized.

In embodiments, the diamond membranes may be used in a wide range of applications, such as including but not limited to: as microfluidic porous membranes (e.g. in medical applications such as membrane or cell diagnostics, filtration devices such as those for water treatment or kidney dialysis, single molecule studies, sensing applications such as real-time diagnosis based on conductive membranes, proton irradiation, transmission electron microscopy grids, conductive membranes for biological studies, membranes for Li-ion batteries or micro fuel cell applications, membranes for gas diffusion or vapor sensors, patterned field emission or thermionic structures, or optical gratings), as conductive patterned electrodes for optical or solar applications, as patterned hydrophobic/hydrophilic regions using patterned diamond (e.g. hydrogen terminated), as master pattern for nanoimprinting or microimprinting (e.g. for replicating a pattern onto a soft polymeric material), or for incorporating diamond nanoparticles with nitrogen vacancy centres (e.g. for quantum devices coupling the membrane to cellular bio-sensors-diamond nanoparticles with nitrogen vacancy centers for opto-electrical readout).

In embodiments, any feature of any embodiment of the second aspect may independently be as correspondingly described for any other aspect or their embodiments.

In a third aspect, the present disclosure relates to a use of an amorphous dielectric layer in the formation of a diamond membrane, wherein the amorphous dielectric layer comprises an exposed surface having an isoelectric point of less than 7, including at most 6.

In embodiments, the amorphous dielectric layer may have an intrinsic (i.e. innate; e.g. before any modification of the exposed surface) isoelectric point of at least 5, including at least 6, such as between 7 and 12. In embodiments, the amorphous dielectric layer may have a relative permittivity of at least 3.9, including at least 7, further including at least 9; the amorphous dielectric layer may, for example, be a high-k dielectric. In embodiments, the amorphous dielectric layer may be an amorphous oxide. In some embodiments, the amorphous dielectric layer may be selected from $Al_2O_3$, $HfO_2$, MgO, GaN or $Ga_2O_3$, likely from $Al_2O_3$, $HfO_2$ or MgO. High-k dielectrics such as $Al_2O_3$, $HfO_2$ or MgO typically have a high intrinsic isoelectric point (e.g. between 7 and 12), which may be brought below 7 using a surface treatment (cf. supra).

In embodiments, any feature of any embodiment of the third aspect may independently be as correspondingly described for any other aspect or their embodiments.

The disclosure will now be described by a detailed description of several embodiments of the disclosure. It is clear that other embodiments of the disclosure can be configured according to the knowledge of the person skilled in the art without departing from the true technical teaching of the disclosure, the disclosure being limited only by the terms of the appended claims.

Example 1: Area-Selective Diamond Membrane Growth Based on Patterning the Amorphous Dielectric Layer We now refer to FIGS. 1a-1c, which shows different steps in the area-selective formation of a non-porous diamond membrane.

We now refer to FIG. 1a$_0$. A Si wafer was provided as a substrate (100) (100).

We now refer to FIG. 1a$_1$. A 7 nm thin $Al_2O_3$ amorphous dielectric layer (200) was deposited onto the substrate (100) using an atomic layer deposition. The exposed surface (210) of the amorphous dielectric layer (200) initially had an isoelectric point of at least 7, e.g. about 8.

We now refer to FIG. 1a$_2$. A $CF_4$-based surface plasma treatment was applied to a second area (220) of the exposed surface (e.g. through a mask; not shown, that can either be removed before step 1b or left in place), thereby fluorinating it and modifying its isoelectric point to less than 7.

We now refer to FIG. 1b. Hydrogen-terminated diamond nanoparticles (300) in a colloidal suspension, the suspension having a pH of about 5.5, were seeded onto the exposed surface (200). The diamond nanoparticle seeds (300) attached to the second area (220) having the isoelectric point of less than 7, while they did not stick to the other (i.e. first) area (210) having the higher isoelectric point.

We now refer to FIG. 1c. Using microwave sources in e.g. an ASTEX reactor (e.g. for small size wafers) or a linear antenna reactor (more suited for large wafers), a low temperature (e.g. 350 to 599° C.) or high temperature (e.g. 600 to 800° C.) diamond formation based on chemical vapour deposition (with $CH_4$ as a carbon source) was used to area-selectively grow the diamond nanoparticle seeds (300) into a diamond layer (400). A diamond layer thickness of e.g. between 100 to 1000 nm, or higher, could be achieved.

Furthermore (not shown), using a dry or wet etching chemistry, the substrate (100) was opened from underneath, up to the amorphous dielectric layer (200). In this way, a diamond membrane was formed over the opening. Optionally, a short ion beam etching was used to rupture and remove the thin amorphous dielectric layer (200) within the opening.

This method of area-selective diamond membrane growth based on patterning the amorphous dielectric layer (cf. example 1) can in embodiments also be combined with an area-selective diamond membrane growth based on patterning the seeded diamond nanoparticles (cf. example 2). For instance, after the step of FIG. 1a$_2$ and before the step of FIG. 1c, a mask layer can be spin-coated over the seeded diamond nanoparticles, and one or more cavities (e.g. relatively small pores and/or larger openings) can be lithographically patterned into the mask layer, thereby exposing the seeded diamond nanoparticles in the cavities. A surface plasma oxidation treatment can then be applied to the exposed surface, thereby re-oxidizing the area of the exposed surface within the cavities and also removing the exposed seeds therein.

Example 2: Area-Selective Diamond Membrane Growth Based on Patterning the Seeded Diamond Nanoparticles We now refer to FIGS. 2a-2k, showing different steps in the area-selective formation of a porous diamond membrane.

We now refer to FIG. 2a. A Si wafer was provided as a substrate (100).

We now refer to FIG. 2b. A 7 nm thin $Al_2O_3$ amorphous dielectric layer (200) was deposited onto the substrate (100) using an atomic layer deposition. The exposed surface (210) of the amorphous dielectric layer (200) initially had an isoelectric point of at least 7, e.g. about 8.

We now refer to FIG. 2c. A $CF_4$-based surface plasma treatment was applied to the exposed surface (210), thereby fluorinating it and modifying its isoelectric point to less than 7.

We now refer to FIG. 2d. Hydrogen-terminated diamond nanoparticles (300) in a colloidal suspension, the suspension having a pH of about 5.5, were seeded onto the exposed surface (220).

We now refer to FIG. 2e. A mask layer (500; e.g. a photoresist layer) was spin-coated over the seeded diamond nanoparticles (300).

We now refer to FIG. 2f. Pores (510) were lithographically patterned into the mask layer (500), thereby exposing the seeded diamond nanoparticles (300) in the pores (510).

We now refer to FIG. 2g. A surface plasma oxidation treatment was applied to the exposed surface (220), thereby re-oxidizing the area (i.e. first area; 210) of the exposed surface within the pores and also removing the exposed seeds (300) therein. An example of suitable plasma oxidation treatment is an oxygen plasma treatment.

We now refer to FIG. 2h. Using microwave sources in e.g. an ASTEX reactor (e.g. for small size wafers) or a linear antenna reactor (more suited for large wafers), a low temperature (e.g. 350 to 599° C.) or high temperature (e.g. 600 to 800° C.) diamond formation based on chemical vapour deposition was used to area-selectively grow the diamond nanoparticle seeds (300) into a diamond layer (400): a porous diamond layer (400), comprising pores (420) corresponding to the area where the exposed seeds (300) were removed, was thereby obtained. The mask layer (500) did not need to be removed prior to this step, as the carbon contained therein could act as a carbon source for the diamond growth, while other compounds typically readily evaporated during the process. A diamond layer thickness of e.g. between 100 to 1000 nm, or higher, could be achieved.

We now refer to FIG. 2i. Using a dry or wet etching chemistry, the substrate (100) was opened from underneath, up to the amorphous dielectric layer (200). In this way, a diamond membrane (410) was formed over the opening (600).

We now refer to FIG. 2j. Optionally, a short ion beam etching was used to rupture and remove the thin amorphous dielectric layer (200) within the opening (600).

We now refer to FIG. 2k, showing a schematic top view of the porous diamond membrane (410) with a regular pattern of pores (420).

Figure 3A:
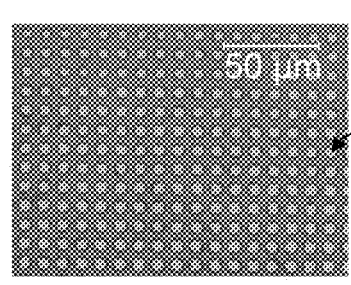
Figure 3B:
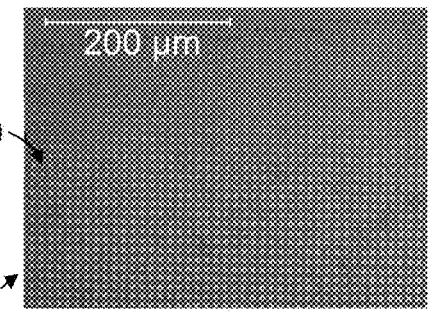
Figure 3C:
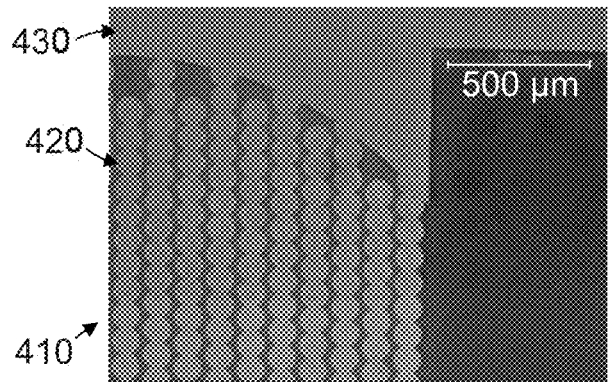
Figure 3D:
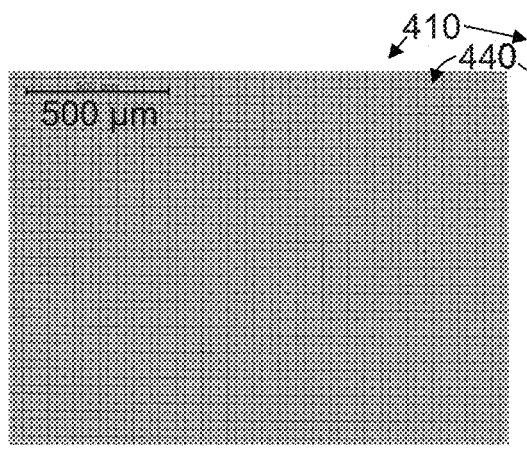
Figure 3E:
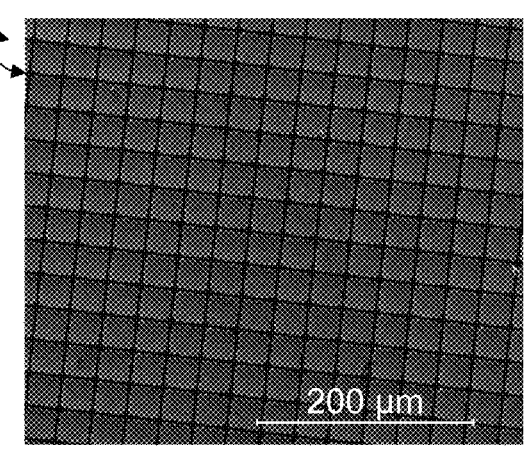

We now refer to FIGS. 3a-3e, which are optical microscopy images of a diamond membrane (410) obtained using the above method. FIGS. 3a and 3b show diamond membranes with a regular pattern of spherical pores (420), at two different length scales. In FIG. 3c, the diamond membrane does not only comprise a pattern of spherical pores (420), but also larger openings (430) are defined therein. FIGS. 3a and 3b show diamond membranes with a grid-pattern, formed by lines (440; e.g. trenches) in the diamond membrane.

Example 3: Halogenation of Amorphous Dielectric Layers

X-ray photoelectron spectroscopy (XPS) measurements were performed to investigate the effect of fluorination on the exposed surface of different amorphous dielectric layers.

Figure 4A:
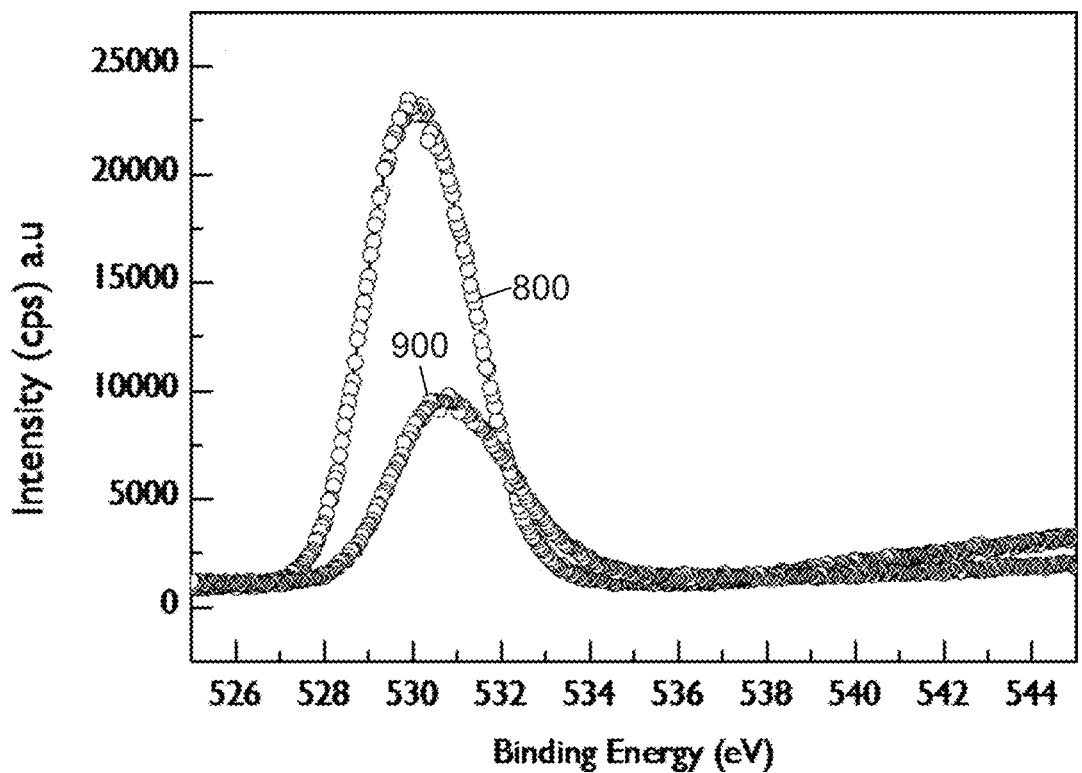
Figure 4B:
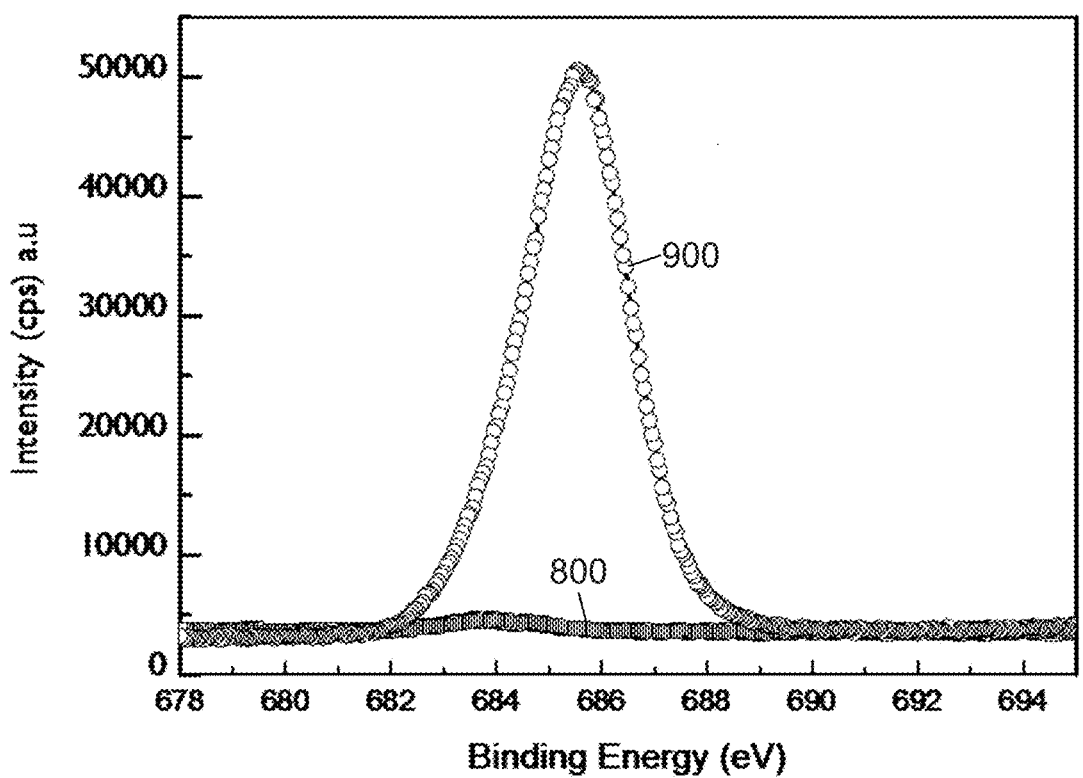

We now refer to FIGS. 4a and 4b. A 7 nm thin layer of $Al_2O_3$ was grown on 100 nm of thermal $SiO_2$ using atomic layer deposition. The exposed surface was subsequently fluorinated using a $CF_4$ based plasma treatment. The results of the XPS measurements for $Al_2O_3$ O-1s (FIG. 4a) and F-1s (FIG. 4b) are shown before (800) and after (900) the plasma treatment.

Figure 5A:
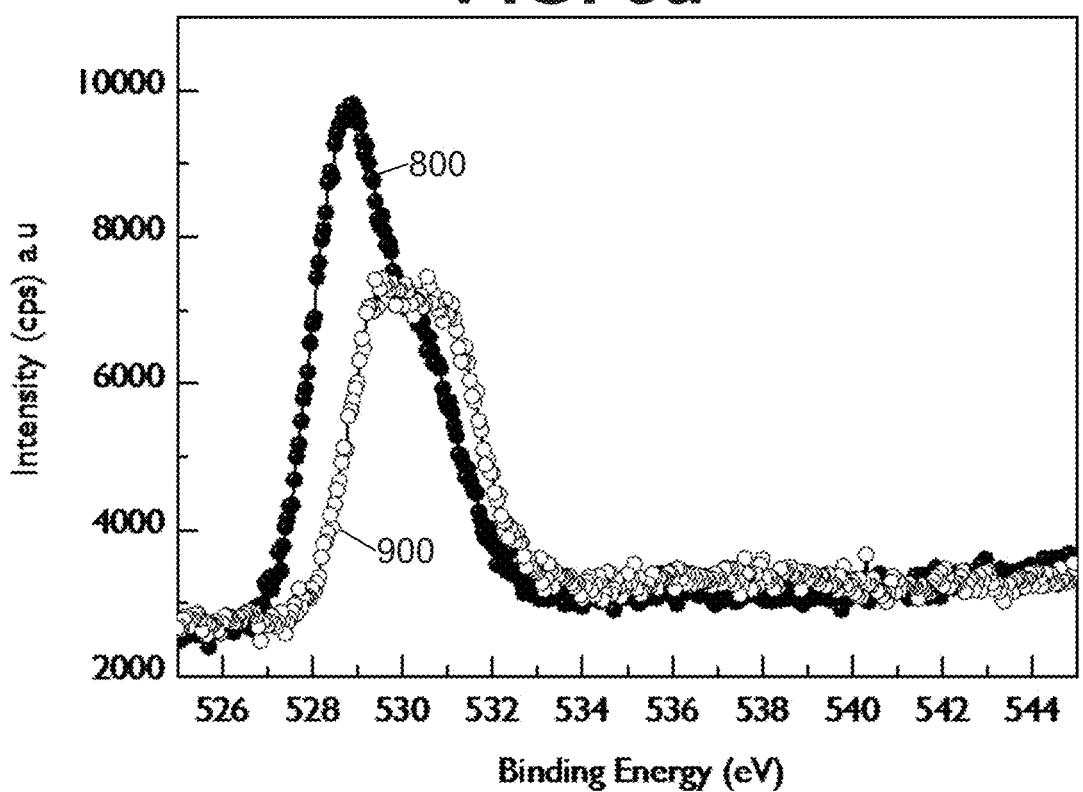
Figure 5B:
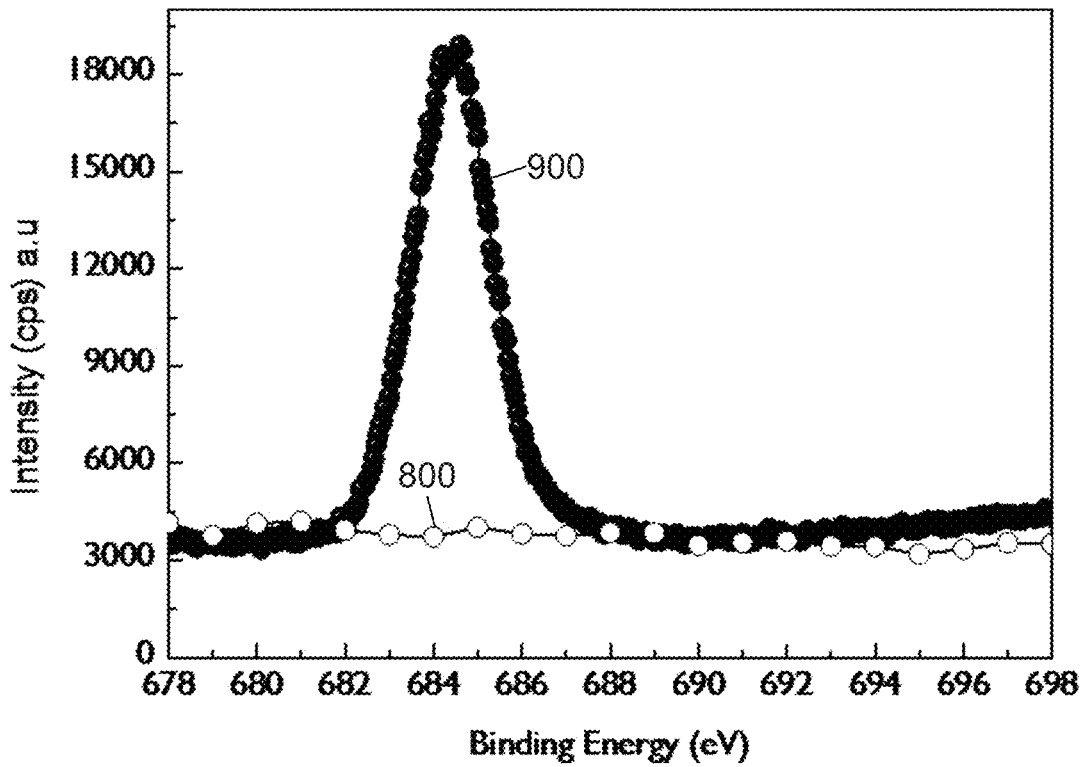

We now refer to FIGS. 5a and 5b. A 7 nm thin layer of $HfO_2$ was grown on 100 nm of thermal $SiO_2$ using atomic layer deposition. The exposed surface was subsequently fluorinated using a $CF_4$ based plasma treatment. The results of the XPS measurements for $HfO_2$ O-1s (FIG. 5a) and F-1s (FIG. 5b) are shown before (800) and after (900) the plasma treatment.

Figure 6A:
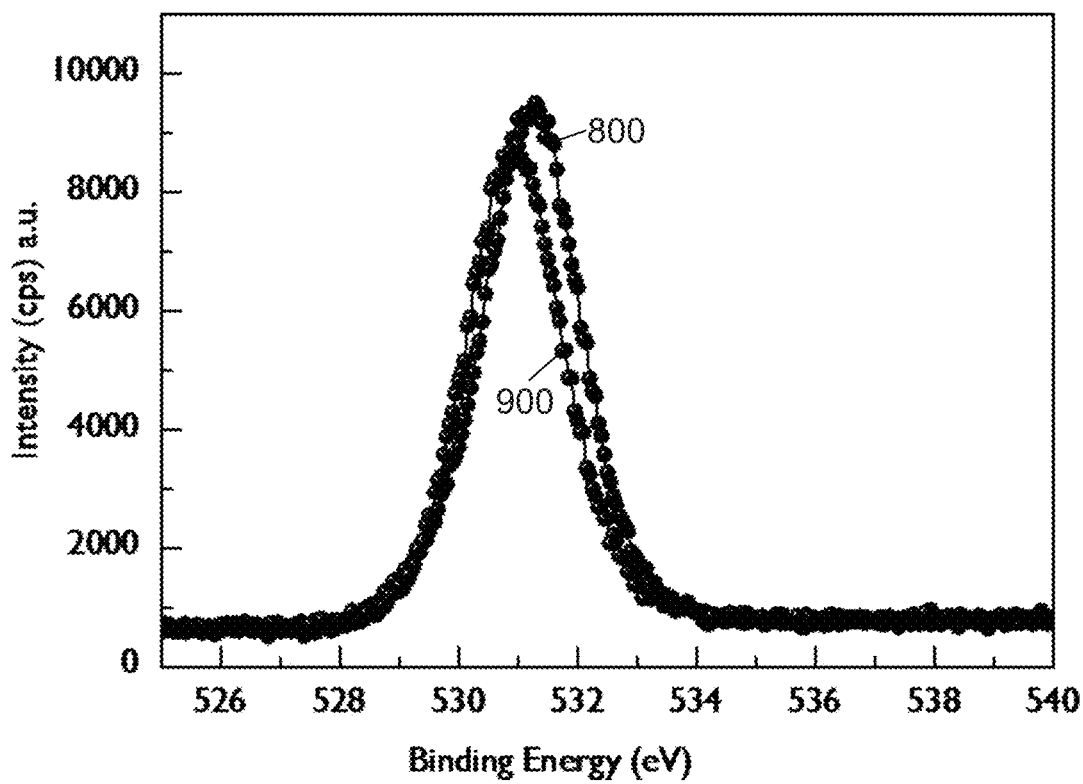
Figure 6B:
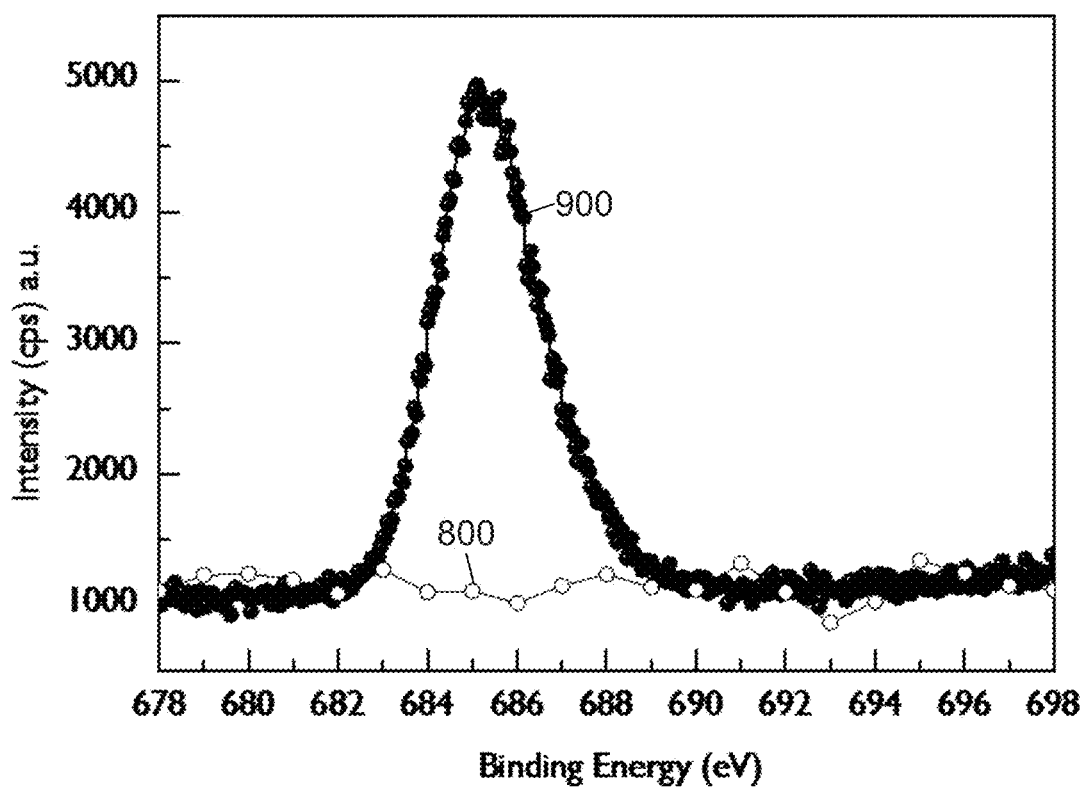

We now refer to FIGS. 6a and 6b. A 20 nm thin layer of MgO was sputtered onto Si. The exposed surface was subsequently fluorinated using a $CF_4$ based plasma treatment. The results of the XPS measurements for MgO O-1s (FIG. 6a) and F-1s (FIG. 6b) are shown before (800) and after (900) the plasma treatment.

In all three cases, a reduction in the O-1s signal and an increase in the F-1s signal could be observed after the plasma treatment, indicating the successful exchange of terminal oxygen with fluorine at the exposed surface. As, for metal oxides in contact with an aqueous environment, this terminal oxygen is typically in the form of hydroxyl species (e.g. $-O_-$ at pH values below the isoelectric point and $-OH_2^+$ at pH values above the isoelectric point), such an exchange directly influences (lowers) the isoelectric point of the exposed surface.

We now refer to FIG. 7. Zeta Potential measurement is a method used to study surface charges present on materials exposed to liquid environments and has been studied to assess stability of colloidal particles in liquid environment. A variant of this technique, known as SZP measurement, has been applied recently to assess the surface charge of similar materials (e.g. dielectric oxides) with planar surfaces. Very few measurements exist up to date to the non-trivial nature of the measurement itself.

FIG. 7 shows such a measure of the surface charge of ALD grown $Al_2O_3$ defined in terms of Zeta potential ($\zeta$) (mV) when exposed to a pH buffer solutions. The standard titrating solution used is 1 mM KCl to achieve the desired pH (2-10). The point at where surface exhibits charge neutrality is the isoelectric point (IEP). The open circles (700) show the response from the as received surface (untreated) and the closed circles (710) show the response from a plasma treated surface when exposed to the pH. In the case of as untreated surface, the IEP measured close to ~8 with a (ζ)~+40 mV. For nanoparticles of same material it can range from 7.5 to 9. Upon surface treatment the IEP is reduced to less than 7 i.e. at ~4 with a (ζ)~−20 mV relative to surface to the surface charge of diamond nanoparticles (for e.g. +50 mV at pH 5.5). This is consistent with XPS peaks (FIGS. 6a and 6b) of similar layers, before and after surface treatment.

Compared to, for example, LPCVD, PECVD, MOCVD, or ALD grown Silicon Nitride ($SiN_x$) (IEP is ~5 before treatment and IEP is ~3 after treatment), the relative change in surface charge is negligible (ΔIEP~2), whereas the high K amorphous dielectric with high IEP enables high-resolution selective area diamond growth, where one region (unexposed surface) has a high IEP (>7) with a positive zeta potential (+ζ) and another region (exposed surface) with a low IEP (<5) with a negative zeta potential (−ζ) and the (ΔIEP~4 and above), relative to the surface charge of the diamond nanoparticles.

It is to be understood that although some embodiments, specific constructions and configurations, as well as materials, have been discussed herein for devices according to the present disclosure, various changes or modifications in form and detail may be made without departing from the scope and technical teachings of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for forming a diamond membrane, comprising:
    providing a substrate having an amorphous dielectric layer thereon, the amorphous dielectric layer comprising an exposed surface, the exposed surface having an isoelectric point of less than 7;
    seeding diamond nanoparticles onto the exposed surface;
    growing a diamond layer from the diamond nanoparticles; and
    forming a hole in the substrate from underneath the diamond layer, the hole extending at least up to the amorphous dielectric layer, thereby forming the diamond membrane over the hole.

2. The method according to claim 1, wherein forming the hole in the substrate from underneath the diamond layer further comprises removing a portion of the amorphous dielectric layer, such that the hole extends up to the diamond layer.

3. The method according to claim 1, further comprising patterning the diamond nanoparticles by removing the diamond nanoparticles in a first area but not in a second area.

4. The method according to claim 3, wherein patterning the diamond nanoparticles comprises:
    providing a mask layer over the diamond nanoparticles;
    patterning at least one opening into the mask layer; and
    removing the diamond nanoparticles within the at least one opening.

5. The method according to claim 3, wherein patterning the diamond nanoparticles comprises using a maskless lithography technique.

6. The method according to claim 1, wherein providing the substrate having the amorphous dielectric layer thereon comprises:
    providing the amorphous dielectric layer on the substrate, the amorphous dielectric layer having an isoelectric point of at least 7; and
    thereafter applying a surface treatment to the exposed surface, thereby modifying the isoelectric point of the exposed surface to be less than 7.

7. The method according to claim 6, wherein the surface treatment comprises a halogenation.

8. The method according to claim 1, wherein growing the diamond layer from the diamond nanoparticles comprises use of a chemical vapor deposition.

9. The method according to claim 1, wherein a carbon-containing auxiliary layer overlays the diamond nanoparticles before the growing of the diamond layer from the diamond nanoparticles and wherein the carbon-containing auxiliary layer acts as a carbon-source during the growing of the diamond layer from the diamond nanoparticles.

10. The method according to claim 1, wherein the diamond layer is a doped diamond layer.

11. The method according to claim 1, wherein the amorphous dielectric layer is $Al_2O_3$, $HfO_2$, or MgO.

12. The method according to claim 1, wherein the exposed surface has a negative zeta potential.

13. The method according to claim 12, wherein the exposed surface is in contact with a medium having a pH higher than the isoelectric point of the exposed surface during seeding diamond nanoparticles onto the exposed surface.

14. A diamond membrane obtained by a method comprising:
    providing a substrate having an amorphous dielectric layer thereon, the amorphous dielectric layer comprising an exposed surface, the exposed surface having an isoelectric point of less than 7;
    seeding diamond nanoparticles onto the exposed surface;
    growing a diamond layer from the diamond nanoparticles; and
    forming a hole in the substrate from underneath the diamond layer, the hole extending at least up to the amorphous dielectric layer, thereby forming the diamond membrane over the hole.

* * * * *